(12) United States Patent
Ellis et al.

(10) Patent No.: US 9,747,157 B2
(45) Date of Patent: Aug. 29, 2017

(54) METHOD AND SYSTEM FOR IMPROVING ERROR CORRECTION IN DATA STORAGE

(71) Applicant: SanDisk Enterprise IP LLC, Dallas, TX (US)

(72) Inventors: Robert W. Ellis, Phoenix, AZ (US); James M. Higgins, Chandler, AZ (US); Mark Dancho, Chandler, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 95 days.

(21) Appl. No.: 14/076,165

(22) Filed: Nov. 8, 2013

(65) Prior Publication Data

US 2015/0135033 A1 May 14, 2015

(51) Int. Cl.
| | | |
|---|---|---|
| G11C 29/00 | (2006.01) | |
| G06F 11/10 | (2006.01) | |
| G11C 11/4074 | (2006.01) | |
| G11C 16/04 | (2006.01) | |

(52) U.S. Cl.
CPC .......... *G06F 11/10* (2013.01); *G06F 11/1048* (2013.01); *G11C 11/4074* (2013.01); *G11C 16/0483* (2013.01)

(58) Field of Classification Search
CPC . G06F 11/1048; G11C 11/4074; G11C 16/00; G11C 16/0483
USPC ........................ 714/763, 758, 745, 704, 708; 365/185.29, 185.09, 185.24, 200, 201
See application file for complete search history.

(56) References Cited

U.S. PATENT DOCUMENTS

| | | |
|---|---|---|
| 5,633,823 A | 5/1997 | Lee |
| 5,721,705 A | 2/1998 | Hong et al. |
| 5,888,867 A | 3/1999 | Wang et al. |
| 6,034,897 A | 3/2000 | Estakhri et al. |
| 6,381,176 B1 | 4/2002 | Kim et al. |
| 7,031,210 B2 | 4/2006 | Park et al. |
| 7,558,109 B2 | 7/2009 | Brandman et al. |
| 7,853,749 B2 | 12/2010 | Kolokowsky |
| 8,000,161 B2 * | 8/2011 | Stan .................. B82Y 10/00 341/50 |
| 8,205,028 B1 | 6/2012 | Sakarda |
| 8,223,551 B2 | 7/2012 | Sarin et al. |
| 8,397,101 B2 | 3/2013 | Goss et al. |
| 8,521,981 B2 * | 8/2013 | Strauss ................ G06F 12/00 711/104 |
| 8,560,770 B2 | 10/2013 | Haines et al. |

(Continued)

FOREIGN PATENT DOCUMENTS

WO WO 2009/111174 9/2009

OTHER PUBLICATIONS

Online Merriam Webster Dictionary, definition of "Distinct" from Jun. 12, 2011, https://web.archive.org/web/20110612181129/http://www2.merriam-webster.com/cgi-bin/mwdictadu?book=Dictionary&va=distinct.

*Primary Examiner* — Christine Tu
(74) *Attorney, Agent, or Firm* — Morgan, Lewis & Bockius LLP (57) ABSTRACT

A method of operation of a data storage system includes: monitoring a data interface bus, the monitoring by a non-volatile memory controller; activating a zero bit counter for detecting a ratio of 1's to 0's on the data interface bus; and adjusting a threshold voltage ($V_{th}$), based on the ratio of the 1's to the 0's from the zero bit counter, by the non-volatile memory controller.

16 Claims, 5 Drawing Sheets

(56) References Cited

U.S. PATENT DOCUMENTS

| | | |
|---|---|---|
| 8,612,669 B1 | 12/2013 | Syu et al. |
| 8,694,811 B2 | 4/2014 | Raju et al. |
| 8,725,931 B1 | 5/2014 | Kang |
| 8,750,052 B2 * | 6/2014 | Aoki .................. G11C 16/0483 365/185.09 |
| 8,793,556 B1 | 7/2014 | Northcott et al. |
| 8,799,747 B2 | 8/2014 | Goss et al. |
| 8,862,818 B1 | 10/2014 | Ozdemir |
| 8,880,838 B2 | 11/2014 | Kaiser et al. |
| 8,984,216 B2 | 3/2015 | Fillingim |
| 9,043,668 B2 | 5/2015 | Goss et al. |
| 9,063,844 B2 | 6/2015 | Higgins et al. |
| 9,069,468 B2 | 6/2015 | Mehra et al. |
| 9,116,401 B2 | 8/2015 | Kim et al. |
| 9,201,728 B2 | 12/2015 | Patapoutian et al. |
| 9,239,781 B2 | 1/2016 | Jones et al. |
| 2002/0156891 A1 | 10/2002 | Ulrich et al. |
| 2006/0022054 A1 | 2/2006 | Elhamias et al. |
| 2006/0080505 A1 | 4/2006 | Arai et al. |
| 2007/0067598 A1 | 3/2007 | Fujimoto |
| 2007/0079152 A1 | 4/2007 | Winick et al. |
| 2008/0028246 A1 | 1/2008 | Witham |
| 2008/0263289 A1 | 10/2008 | Hosoya et al. |
| 2009/0132756 A1 | 5/2009 | Hsieh |
| 2009/0172248 A1 | 7/2009 | You |
| 2009/0179707 A1 | 7/2009 | Higashino |
| 2009/0183183 A1 | 7/2009 | Muppirala et al. |
| 2009/0300238 A1 | 12/2009 | Panabaker et al. |
| 2010/0082890 A1 | 4/2010 | Heo et al. |
| 2010/0122019 A1 | 5/2010 | Flynn et al. |
| 2010/0223531 A1 | 9/2010 | Fukutomi et al. |
| 2010/0325340 A1 | 12/2010 | Feldman et al. |
| 2011/0055455 A1 | 3/2011 | Post et al. |
| 2011/0078295 A1 | 3/2011 | Kavuri et al. |
| 2011/0107144 A1 | 5/2011 | Ohara |
| 2011/0138100 A1 | 6/2011 | Sinclair |
| 2011/0173395 A1 | 7/2011 | Bhattacharjee et al. |
| 2012/0023144 A1 | 1/2012 | Rub |
| 2012/0057410 A1 | 3/2012 | Yu et al. |
| 2012/0079348 A1 | 3/2012 | Naeimi |
| 2012/0079355 A1 | 3/2012 | Patapoutian et al. |
| 2012/0096217 A1 | 4/2012 | Son et al. |
| 2012/0185706 A1 | 7/2012 | Sistla et al. |
| 2012/0203951 A1 | 8/2012 | Wood et al. |
| 2012/0266011 A1 | 10/2012 | Storer et al. |
| 2012/0275233 A1 | 11/2012 | Sarin et al. |
| 2012/0278530 A1 | 11/2012 | Ebsen |
| 2012/0278531 A1 | 11/2012 | Horn |
| 2012/0317334 A1 | 12/2012 | Suzuki et al. |
| 2013/0061019 A1 | 3/2013 | Fitzpatrick et al. |
| 2013/0073797 A1 | 3/2013 | Chowdhury |
| 2013/0074093 A1 | 3/2013 | Gounares et al. |
| 2013/0104005 A1 | 4/2013 | Weingarten et al. |
| 2013/0205102 A1 | 8/2013 | Jones et al. |
| 2013/0219248 A1 | 8/2013 | Sakurai |
| 2013/0232290 A1 | 9/2013 | Ish et al. |
| 2013/0297986 A1 * | 11/2013 | Cohen ................ G06F 11/1012 714/763 |
| 2013/0297988 A1 * | 11/2013 | Wu .................... G06F 11/1068 714/773 |
| 2013/0304998 A1 | 11/2013 | Palmer |
| 2013/0305093 A1 | 11/2013 | Jayachandran et al. |
| 2013/0326116 A1 | 12/2013 | Goss et al. |
| 2014/0036589 A1 | 2/2014 | Parthasarathy et al. |
| 2014/0059359 A1 | 2/2014 | Bahirat |
| 2014/0156966 A1 | 6/2014 | Ellis et al. |
| 2014/0158525 A1 | 6/2014 | Greene |
| 2014/0181370 A1 | 6/2014 | Cohen et al. |
| 2014/0258769 A1 | 9/2014 | Baryudin et al. |
| 2014/0372777 A1 | 12/2014 | Reller et al. |
| 2015/0177999 A1 | 6/2015 | Gakhal et al. |

* cited by examiner

METHOD AND SYSTEM FOR IMPROVING ERROR CORRECTION IN DATA STORAGE

TECHNICAL FIELD

The present invention relates generally to a data storage system, and more particularly to a system for enhancing data reliability through error correction and adjustment.

BACKGROUND ART

Data storage systems can include an array of storage mechanisms, such as hard disk drives (HDD), solid state disks (SSD), optical disk drives and tape drives. Each of the storage mechanisms has some deficiency that could lead to loss of the stored data over time. In order to address these issues manufacturers have struggled to define preventive/recovery processes that, when applied to the storage mechanism, can possibly restore the lost data. The typical approach is to add layers of error correction codes (ECC) to the data. This approach can reduce the usable capacity and can be ineffective if the data errors exceed the correction capability of the error correction codes.

In applications where the preservation of the data is of the utmost importance most manufacturers suggest using a back-up strategy that keeps a reserved copy of the data in multiple devices in order to reduce the probability that the data can be lost. The manufacturers of hard disk drives and solid state disks maintain internal spare capacity in order to exchange the storage location of data that is found to have ECC correctable errors.

While hard disk drives can suffer mechanical, magnetic, and electrical failure mechanisms, solid state disks are only susceptible to electrical issues. The non-volatile media of the solid state disks can lose charge due to the age of the media or long data retention times. Each time a storage location of a solid state disk is written or read, the dielectric that surrounds the floating gate is damaged by use. As integrated circuit technology continues to shrink and crystalline layers get thinner, the solid state disks will be increasingly dependent upon data recovery processes to combat the loss of charge in the cells.

Thus, a need still remains for a data storage system with error correction mechanism in order to maintain the integrity of data stored in solid state disks. In view of the growing requirement to archive and store data, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

The present invention provides an improved error correction method and system of a data storage system. In one implementation, improving error correction can include monitoring a data interface bus of a non-volatile memory controller for determining a balance of the data. The balance of the data can be monitored by activating a zero bit counter for detecting a ratio of 1's to 0's on the data interface bus. Since the data was written with a balance of the number of 1's and 0's, any imbalance can be corrected by adjusting a threshold voltage ($V_{th}$), based on the ratio of the 1's to the 0's from the zero bit counter, by the non-volatile memory controller.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system may be drawn not to scale. Similarly, although the views in the drawings for ease of description generally show similar orientations, this depiction in the figures is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

Various embodiments described here include a new approach for error correction in a data storage system. This approach includes a method including: monitoring a data interface bus from a non-volatile memory controller; activating a zero bit counter for detecting a ratio of 1's to 0's on the data interface bus; and adjusting a threshold voltage ($V_{th}$), based on the ratio of the 1's to the 0's from the zero bit counter, by the non-volatile memory controller.

An embodiment of the present invention provides a data storage system including: monitoring a data interface bus from a non-volatile memory controller; activating a zero bit counter for detecting a ratio of 1's to 0's on the data interface bus; and adjusting a threshold voltage (Vth), based on the ratio of the 1's to the 0's from the zero bit counter, by the non-volatile memory controller.

Figure 1:
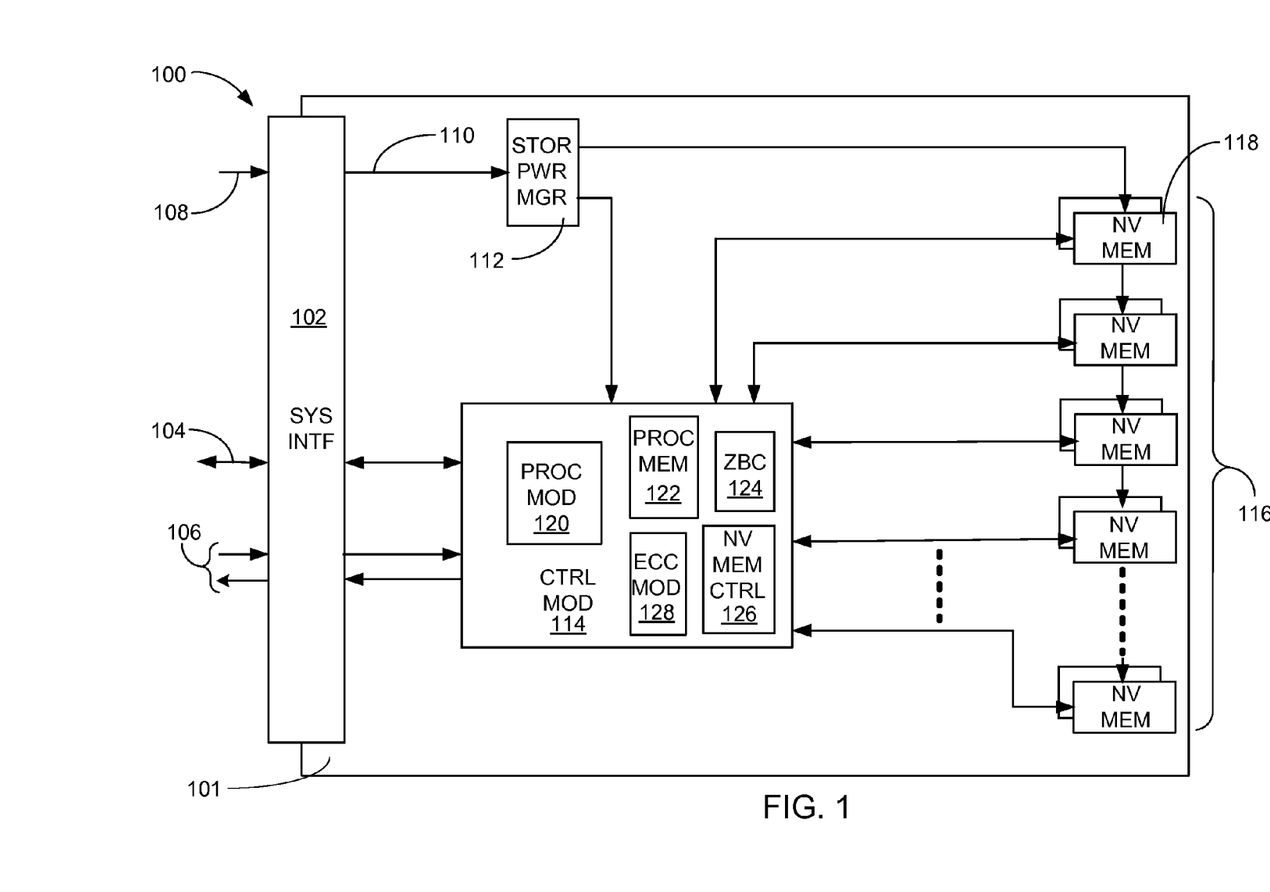
FIG. 1 is a block diagram of a data storage system with error correction mechanism in a first embodiment of the present invention.

Referring now to FIG. 1, therein is shown a block diagram of a data storage system 100 with error correction mechanism in a first embodiment of the present invention. The block diagram of the data storage system 100 depicts a substrate 101 with a system interface 102, such as a system electronic interface, having a data interface 104, a command interface 106, and a system power interface 108. A storage power line 110 can be sourced from the system interface 102 and coupled to a storage power manager 112.

The storage power manager 112 can provide operational power and alerts to a controller module 114 and an array 116 of a non-volatile memory device 118. The non-volatile memory device 118 can be NAND flash memory, single-level cell (SLC) flash memory, or multi-level cell (MLC) flash memory. The controller module 114 can be a hardware module having a processor module 120, a processor memory module 122, a zero bit counter 124, a non-volatile memory controller 126, and an error correction module 128.

The processor module 120 can perform maintenance and support tasks for the data storage system 100. The processor memory module 122 can be coupled to the processor module 120 to operate as data cache, temporary storage, instruction storage, and interface state memory.

The zero bit counter 124 is a hardware structure coupled between the non-volatile memory controller 126, and the error correction module 128. The zero bit counter 124 can monitor the transfer of data from the non-volatile memory controller 126 before any error correction is applied by the error correction module 128 and without inducing any latency in the data path. The hardware for the zero bit counter 124 can be a detector that allows the processor module 120 to perform the actual count or a full hardware counter that can provide a status count to the processor module 120, the non-volatile memory controller 126, or a combination thereof.

Data written to the non-volatile memory device 118 can be randomized for either security reasons or for endurance and retention requirements. The resulting data is known to have high entropy, such as 50% 1's and 50% 0's. The number of data bits written at a value of 1 or 0 can be predicted. As the non-volatile memory device 118 ages a ratio of the number of 1's to 0's will change due to charge depletion in the non-volatile memory device 118. The charge depletion can occur due to the age of the data or an excessive number of reads of the data in the non-volatile memory device 118.

In normal operation, spurious data errors can be corrected by the error correction module 128 without re-reading the erroneous data blocks. As the charge is depleted with a given threshold voltage ($V_{th}$), the ratio of the number of 1's to 0's will change. If left unchecked, the ratio of 1's to 0's will continue to change beyond the point where the error correction module 128 can correct the data stream.

The processor module 120 can detect the increasing use of the error correction module 128. The processor module 120 can activate the zero bit counter 124 in order to identify a current state of the ratio of 1's to 0's. By analyzing the ratio of 1's to 0's, the processor module 120 can instruct the non-volatile memory controller 126 to adjust the threshold voltage ($V_{th}$) values in the non-volatile memory device 118. The output of the zero bit counter 124 can indicate the number of detected data bits that have a zero value. As the charge is depleted from the non-volatile memory device 118, the output of the zero bit counter 124 can provide an indication of the direction and amount of change required in the threshold voltage ($V_{th}$) values in order to maintain the ratio of 50% 1's and 50% 0's. The output of the zero bit counter 124 can provide an accurate indication, even if the data becomes uncorrectable, by using the ratio of 1's to 0's in the data stream to set the direction and amount of the threshold voltage ($V_{th}$) adjustment needed for the next read operation.

It is understood that the activation of the zero bit counter 124 can be part of an error recovery process or as part of a continuous monitoring of the condition of the data within the non-volatile memory device 118. It is further understood that the adjustments of the threshold voltage ($V_{th}$) can be implemented to automatically apply to the non-volatile memory device 118 without intervention of the processor module 120. The ratio of the of 1's to 0's can be a linear indicator of the amount of charge depletion that has taken place in the non-volatile memory device 118 as a result of read activity, age of the data, or a combination thereof.

It has been discovered that the zero bit counter 124 can determine the direction and amount of change required in the threshold voltage ($V_{th}$) of the non-volatile memory device 118. The zero bit counter 124 can provide accurate adjustments to the threshold voltage ($V_{th}$) of the non-volatile memory device 118 even when the data stream is uncorrectable by the error correction module 128. It has further been discovered that the zero bit counter 124 can quickly identify special data sequences for erase blocks within the non-volatile memory device 118 that have been flagged as spare, recycled, or retired. The zero bit counter 124 can also be used to capture a histogram of the relative state of the erase blocks within the non-volatile memory device 118 for diagnostic or characterization purposes.

The operation of the zero bit counter 124 can apply to the NAND flash memory, the single-level cell (SLC) flash memory, or the multi-level cell (MLC) flash memory. In adjusting the threshold voltage ($V_{th}$) of the multi-level cell (MLC) flash memory, there can be two threshold adjustments required to address the least significant page and the most significant page. The relationship of the ratio of the 1's to 0's is maintained through the data of all of the versions of the non-volatile memory device 118.

When using the non-volatile memory device 118 as a multi-level cell (MLC) flash memory the ratio of 1's to 0's in the least significant bit (LSB) page verses the most significant bit (MSB) page can be determined by the zero bit counter 124 to adjust the threshold voltage ($V_{th}$). The zero bit counter 124 can be used to tune the parameters for the erase and programming operation on the next write cycle, thus improving the bit error rate on the non-volatile memory device 118 (erase block). The ratio of 1's or 0's in the LSB page to the number of 1's or 0's in the MSB page can be used to adjust either the threshold voltage ($V_{th}$) values or the program/erase settings knowing the data in the two pages should have the same number of 1's or 0's as the sibling page.

It has been discovered that by intentionally skewing the ratio of the 1's to 0's for specially flagged erase blocks or pages within the non-volatile memory device 118, the zero bit counter 124 can be used to positively identify the ratio of the 1's to 0's in order to speed-up the identification of the specially flagged erase blocks. By way of an example, the processor module 120 can utilize the zero bit counter 124 during the life-cycle of the erase blocks within the non-volatile memory device 118 to tag the erase blocks as erased, spare, recycled, or retired.

Figure 2:
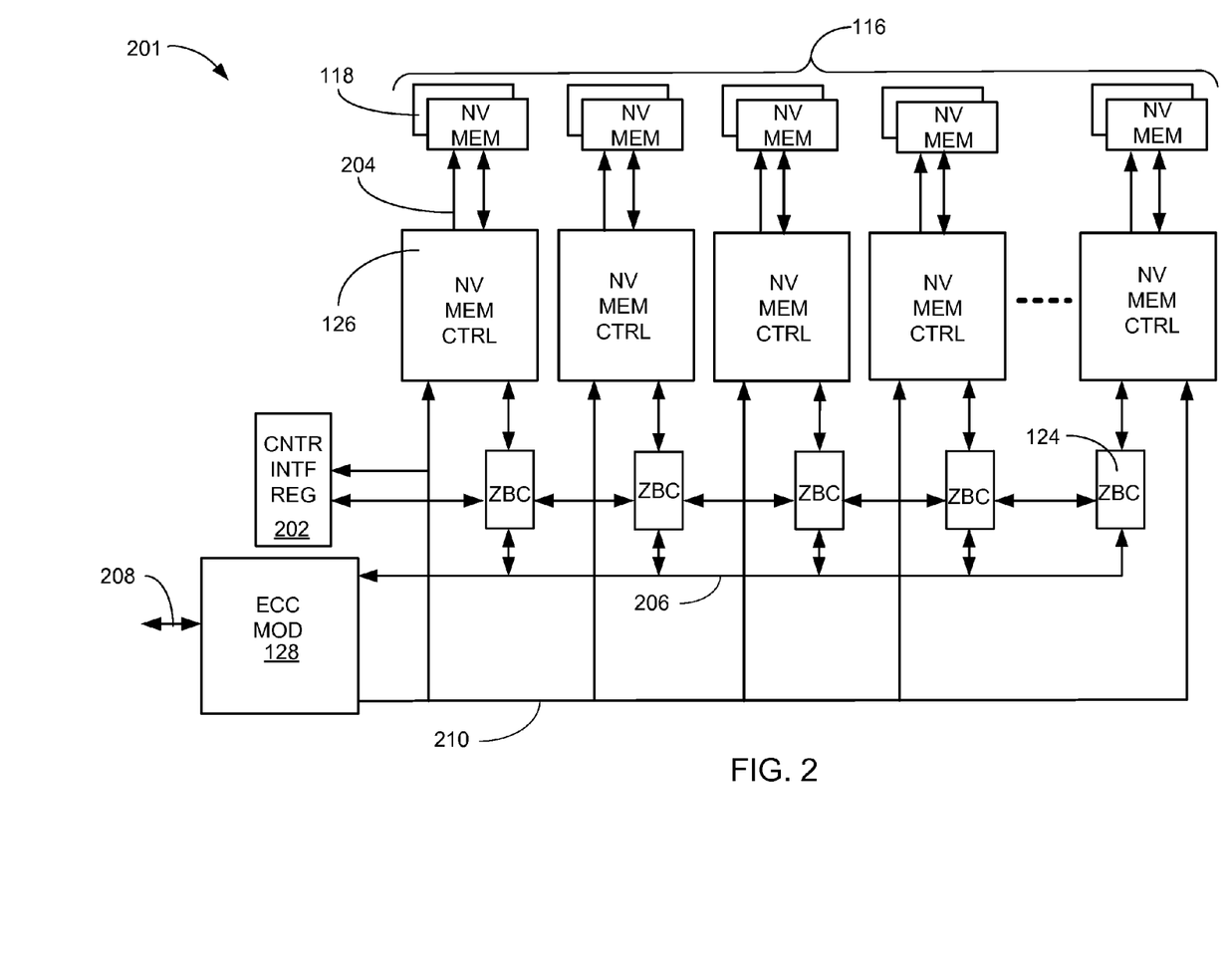
FIG. 2 is a detailed block diagram of a portion of the data storage system of FIG. 1.

Referring now to FIG. 2, therein is shown a detailed block diagram of a portion 201 of the data storage system 100 of FIG. 1. The detailed block diagram of the portion 201 of the data storage system 100 depicts a counter interface register 202 coupled to each of the zero bit counter 124. The counter interface register 202 can be part of or accessed by the processor module 120 of FIG. 1 to activate the zero bit counter 124 and read the output of the zero bit counter 124 at any time. The zero bit counter 124 can accumulate the number of the 0's that are transferred by the non-volatile memory controller 126 during the reading of data from the non-volatile memory device 118. The counter interface register 202 can convey the output of the zero bit counter 124, through the counter interface register 202, to the processor module 120 or the non-volatile memory controller 126 at the end of a data transfer.

By way of an example, the counter interface register 202 can configure the zero bit counter 124 to communicate directly with the non-volatile memory controller 126 in order to provide continuous feedback on the ratio of the 1's to 0's. The non-volatile memory controller 126 can be configured to utilize the output of the zero bit counter 124 to track changes in bit error rate (BER) of the raw data from the array 116 of the non-volatile memory device 118, which can show-up as the change in ratio of the 1's to 0's. Any changes in a threshold voltage ($V_{th}$) 204 can be monitored by the processor module 120 in order to determine when data that has been charge depleted should be re-written in a new location.

In another example, the error correction module 128 can communicate through a data interface bus 206 in order to flag an uncorrectable error correction code (ECC) error 210 to the zero bit counter 124 and the counter interface register 202. Such a communication can trigger the zero bit counter 124 to send the last captured ratio of the 1's to 0's to the non-volatile memory controller 126. The non-volatile memory controller 126 can adjust the threshold voltage ($V_{th}$) 204 in the non-volatile memory device 118 in order to prevent a reoccurrence of the uncorrectable error correction code (ECC) error 210 for re-reading the data blocks. These examples require very little support from the processor module 120 during actual data transfers.

It has been discovered that the zero bit counter 124 and the counter interface register 202 can allow the operational performance of the data storage system 100 to be enhanced without adding additional burden on the processor module 120. The reduction in overhead to the processor module 120 can allow implementation of a less expensive version of the processor module 120 or allow the processor module 120 to support an increase in the size of the array 116 of the non-volatile memory device 118 while maintaining a constant performance level of the data storage system 100.

It is understood that the position of the zero bit counter 124, between the non-volatile memory controller 126 and the error correction module 128, can provide the feedback required to maintain the data integrity of the non-volatile memory device 118 prior to any correction being applied to a data stream 208. The uncorrectable error correction code (ECC) error 210 can be coupled between the error correction module 128 and each of the non-volatile memory controller 126. While only a single connection to the error correction module 128 is shown there can be one of the uncorrectable error correction code (ECC) error 210 for each of the non-volatile memory controller 126. This configuration can allow a "per channel" operation of the zero bit counter 124 by the non-volatile memory controller 126.

It is understood that the non-volatile memory device 118 shown in the figures can be any number of the non-volatile memory device 118 dedicated to a particular instance of the non-volatile memory controller 126 representing a discrete channel within the data storage system 100. While the counter interface register 202 is shown having the zero bit counter 124 in a serial chain configuration, this is an example only and a discrete connection between each of the zero bit counter 124 and the counter interface register 202 is possible. The counter interface register 202 can have discrete register sets for each of the zero bit counter 124.

Figure 3:
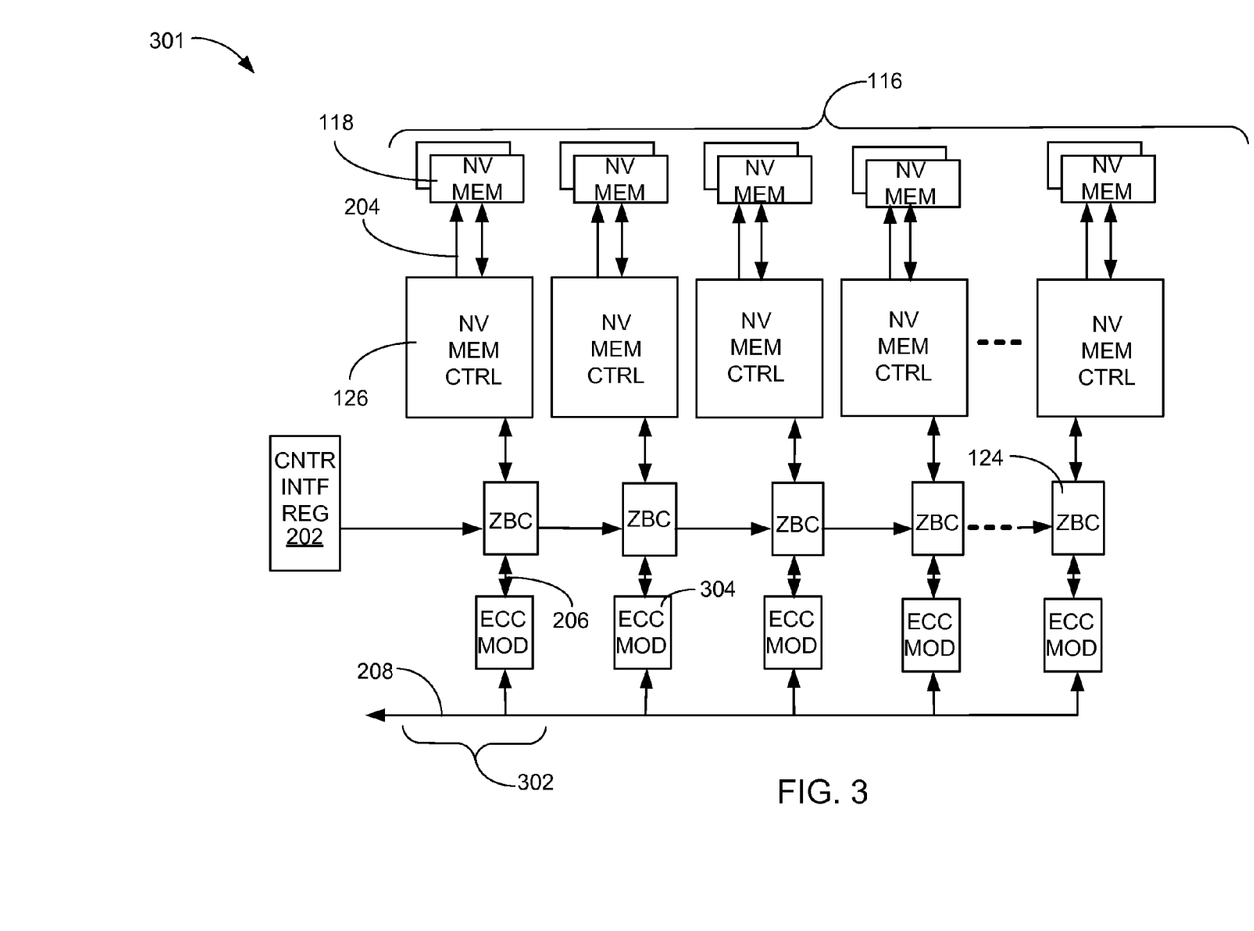
FIG. 3 is a detailed block diagram of a portion of the data storage system of FIG. 1 in a per channel configuration.

Referring now to FIG. 3, therein is shown a detailed block diagram of a portion 301 of the data storage system 100 of FIG. 1 in a per channel configuration. The detailed block diagram of the portion 301 of the data storage system 100 depicts a storage channel 302 having an error correction module 304, the zero bit counter 124, the non-volatile memory controller 126, and the non-volatile memory device 118.

The error correction module 304 can provide the same services as the error correction module 128 of FIG. 1 but it is limited to supporting only a single instance of the storage channel 302. The error correction module 304 can be configured to activate the zero bit counter 124 through the data interface bus 206 based on the number of bits that must be corrected in the data stream 208. This configuration can anticipate the requirement for an adjustment of the threshold voltage ($V_{th}$) 204 in the non-volatile memory device 118 prior to actually encountering an uncorrectable error in the data stream 208. Any skew in the ratio of the 1's to 0's can be detected by the processor module 120 of FIG. 1, on a per channel basis, through the counter interface register 202.

The processor module 120 can maintain a histogram of the charge in each cell viewed by sweeping the threshold voltage ($V_{th}$) 204 in the non-volatile memory device 118 for each of the storage channel 302. The histogram of the threshold voltage ($V_{th}$) 204 can be an indicator of the general reliability of the data storage system 100. The speed of change in the threshold voltage ($V_{th}$) 204 can be indicative of the charge depletion rate of the non-volatile memory device 118.

It has been discovered that the processor module 120 can maintain the histogram of the threshold voltage ($V_{th}$) 204 in the non-volatile memory device 118 for communicating predictive failure information through the system interface 102 of FIG. 1. The histogram of the threshold voltage ($V_{th}$) 204 can estimate the current runtime age of the non-volatile memory device 118. The information provided through the zero bit counter 124 can improve the performance and reliability of the data storage system 100 by compensating for charge depletion within the erase blocks of the non-volatile memory device 118.

Figure 4:
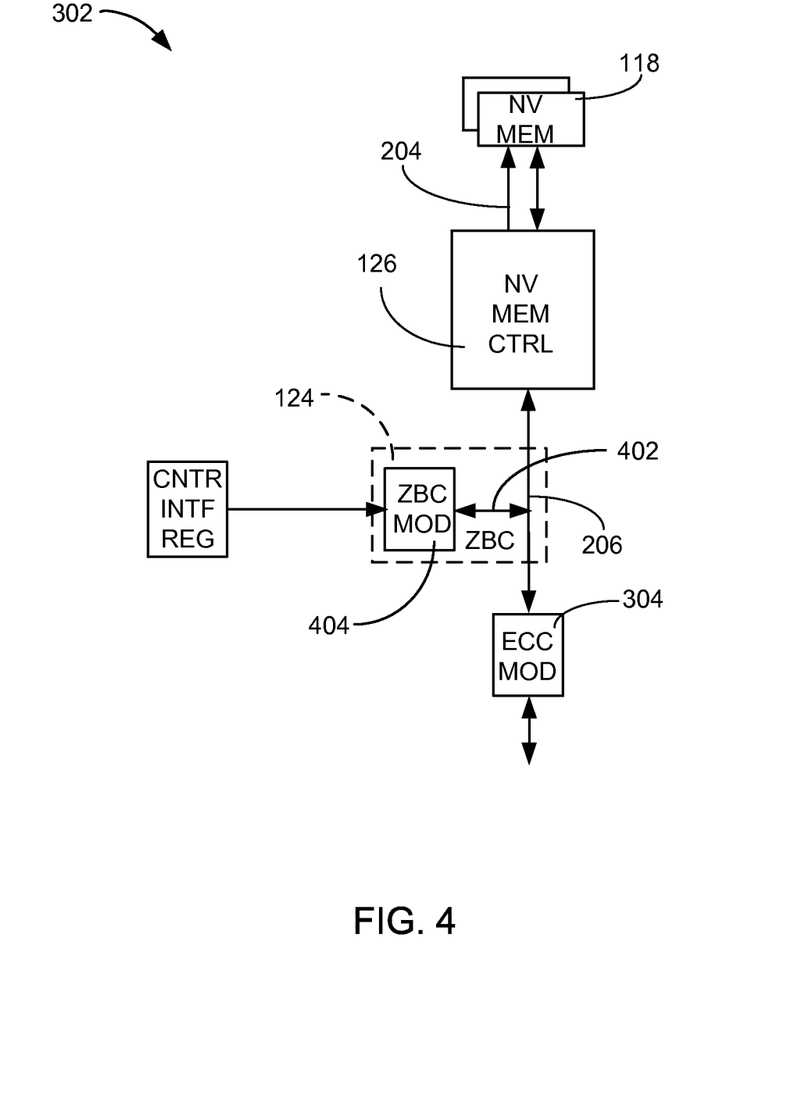
FIG. 4 is a detailed block diagram of the storage channel.

Referring now to FIG. 4, therein is shown a detailed block diagram of the storage channel 302. The detailed block diagram of the storage channel 302 includes an error correction module 304, the zero bit counter 124, the non-volatile memory controller 126, and the non-volatile memory device 118.

The error correction module 304 can be coupled to the non-volatile memory controller 126 by the data interface bus 206. A snoop connection 402, such as a high impedance probe connection, can couple the data interface bus 206 to a zero bit counter module 404. The snoop connection 402 can monitor the data interface bus 206 without adding latency to the path. It is critical that the addition of the zero bit counter 124 does not add latency to the data interface bus 206 as any additional latency could alter the data received by the error correction module 304.

The zero bit counter module 404 can be implemented as a full hardware counter, a single cycle half adder, used to accumulate the counts, a software counter operating on a hardware interface, or a combination thereof. The snoop connection 402 can provide a high impedance connection between the zero bit counter 404 and the data interface bus 206 without adding latency to the data interface bus 206.

The zero bit counter 124, having the snoop connection 402 and the zero bit counter module 404, can perform valuable characterization and diagnostic functions by monitoring the charge depletion within the non-volatile memory device 118. The processor module 120 of FIG. 1 can track the adjustments of the threshold voltage ($V_{th}$) 204 as an indication of the general reliability of the erase blocks within the non-volatile memory device 118.

It has been discovered that the zero bit counter 124, having the snoop connection 402 and the zero bit counter module 404, can provide reliability and projected failure information that has not been available in solid state disks (SSD's). The processor module 120 of FIG. 1 can utilize the output of the zero bit counter 124 to spread the work load among the more reliable of the storage channel 302 in order to extend the useable life of the data storage system 100 of FIG. 1.

It has also been discovered that the zero bit counter 124 can be used in the recycling and tagging of erase blocks within the non-volatile memory device 118 by verifying the charge retention of the erase blocks for different duration of write/erase cycles, which can allow the use erase blocks that would have to be retired without the reliability information provided by the data storage system 100. The zero bit counter 124 can also provide the direction and amplitude changes of the threshold voltage ($V_{th}$) 204 for erase blocks with unrecoverable ECC errors as determined by the error correction module 304.

Figure 5:
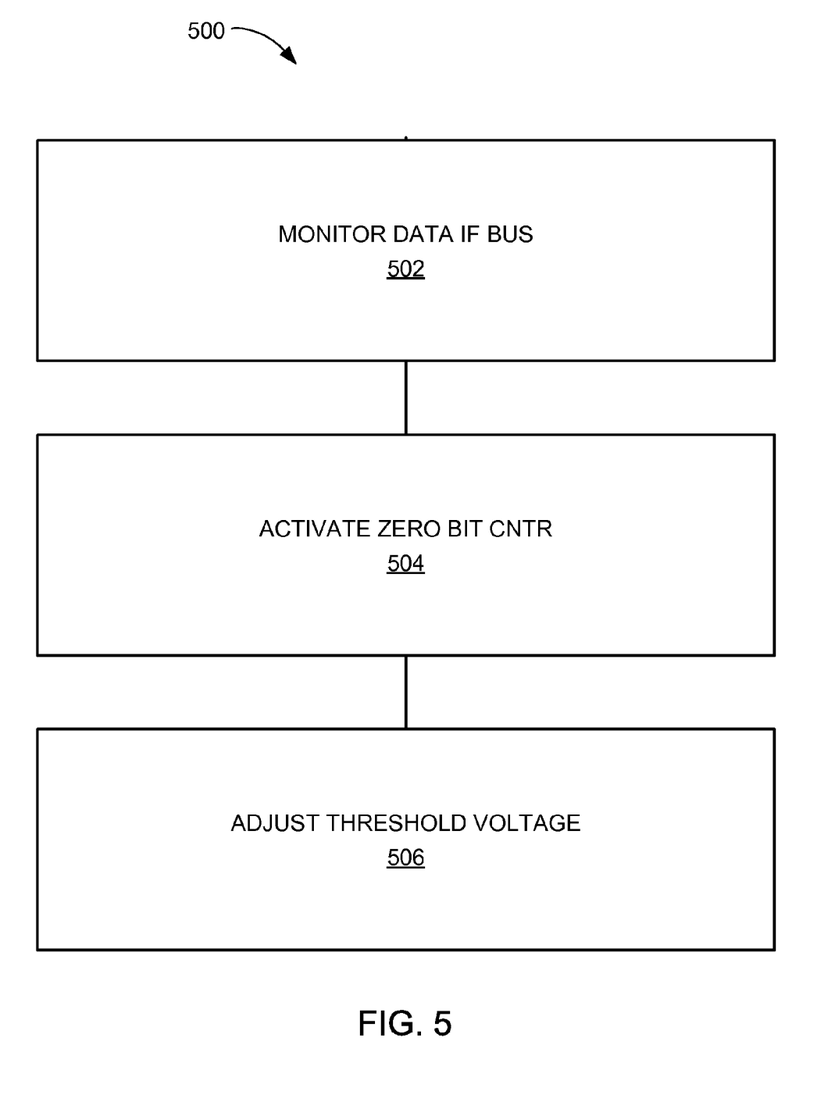
FIG. 5 is a flow chart of a method of operation of a data storage system in a further embodiment of the present invention.

Referring now to FIG. 5, therein is shown a flow chart of a method 500 of operation of a data storage system in a further embodiment of the present invention. The method 500 includes: monitoring a data interface bus from a non-volatile memory controller in a block 502; activating a zero bit counter for detecting a ratio of 1's to 0's on the data interface bus in a block 504; and adjusting a threshold voltage ($V_{th}$), based on the ratio of the 1's to the 0's from the zero bit counter, by the non-volatile memory controller in a block 506.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for improving error correction in a data storage system comprising:
   monitoring a data interface bus that couples a non-volatile memory controller to an error correction module, the monitoring by the non-volatile memory controller;
   activating a zero bit counter comprising a hardware structure distinct from the non-volatile memory controller and coupled to the data interface bus for detecting a ratio of 1's to 0's on the data interface bus;
   adjusting a read threshold voltage ($V_{th}$) in one or more non-volatile memory devices, based on the ratio of the 1's to the 0's from the zero bit counter, by the non-volatile memory controller; and
   reading data, from a non-volatile memory device of the one or more non-volatile memory devices, by the non-volatile memory controller using the adjusted read threshold voltage.

2. The method as claimed in claim 1, further comprising detecting an uncorrectable error condition with respect to data read from the one or more non-volatile memory devices; wherein the adjusting of the read threshold voltage is performed to prevent a reoccurrence of the uncorrectable error condition.

3. The method as claimed in claim 1, wherein activating the zero bit counter is in response to the error correction module detecting an uncorrectable error.

4. The method as claimed in claim 1, further comprising:
   determining an amount and direction by which to adjust the read threshold voltage;
   wherein the adjusting includes adjusting the read threshold voltage in the determined direction by the determined amount.

5. The method as claimed in claim 1, further comprising accessing a non-volatile memory device of the one or more non-volatile memory devices by the non-volatile memory controller for driving the data interface bus.

6. The method of claim 1, wherein the one or more non-volatile memory devices are flash memory devices.

7. The method as claimed in claim 1, further comprising accessing a non-volatile memory device of the one or more non-volatile memory devices by the non-volatile memory controller for driving the data interface bus including coupling a snoop connection to the data interface bus without adding latency between the non-volatile memory controller and the error correction module.

8. A data storage system comprising:
   one or more non-volatile memory devices;
   an error correction module;
   a non-volatile memory controller for accessing data in the one or more non-volatile memory devices and driving a data interface bus that couples the non-volatile memory controller to the error correction module;
   a zero bit counter, coupled to the data interface bus and distinct from the non-volatile memory controller, for detecting a ratio of 1's to 0's on the data interface bus; and
   a read threshold voltage ($V_{th}$) adjusted by the non-volatile memory controller based on the ratio of the 1's to the 0's from the zero bit counter;
   wherein the non-volatile memory controller is configured to read data from a non-volatile memory device of the one or more non-volatile memory devices using the adjusted read threshold voltage.

9. The system as claimed in claim 8, wherein the non-volatile memory controller is configured to detect an uncorrectable error condition with respect to data read from the one or more non-volatile memory devices; wherein the read threshold voltage is adjusted to prevent a reoccurrence of the uncorrectable error condition.

10. The system as claimed in claim 8, wherein the error correction module is configured to detect an uncorrectable error; wherein the zero bit counter is activated in response to the error correction module detecting the uncorrectable error.

11. The system as claimed in claim 8, further comprising:
a counter interface register coupled to the zero bit counter for conveying the ratio of the 1's to the 0's accumulated from the data interface bus; and
a processor module, coupled to the counter interface register, for determining an amount and direction by which to adjust the read threshold voltage ($V_{th}$);
wherein the read threshold voltage is adjusted by the non-volatile memory controller in the determined direction by the determined amount.

12. The system as claimed in claim 8, wherein a non-volatile memory device of the one or more non-volatile memory devices is accessed by the non-volatile memory controller for driving the data interface bus.

13. The system as claimed in claim 8,
wherein:
the zero bit counter, coupled to the data interface bus, is coupled between the error correction module and the non-volatile memory controller.

14. The system as claimed in claim 8, wherein a non-volatile memory device of the one or more non-volatile memory devices is coupled to and read by the non-volatile memory controller using the adjusted read threshold voltage ($V_{th}$) without an uncorrectable error correction code (ECC) error detected by the error correction module.

15. The system as claimed in claim 8, wherein the one or more non-volatile memory devices are flash memory devices.

16. The system as claimed in claim 8, wherein a non-volatile memory device of the one or more non-volatile memory devices is accessed by the non-volatile memory controller for driving the data interface bus and the system includes a snoop connection coupled to the data interface bus without adding latency between the non-volatile memory controller and the error correction module.

* * * * *